(12) United States Patent
Van Wyk et al.

(10) Patent No.: US 11,985,797 B2
(45) Date of Patent: May 14, 2024

(54) COOLING DEVICE FOR DISSIPATING HEAT FROM AN OBJECT

(71) Applicant: Telefonaktiebolaget LM Ericsson (publ), Stockholm (SE)

(72) Inventors: Stevin Van Wyk, Stockholm (SE); Mikkel Myhre, Järfälla (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 11 days.

(21) Appl. No.: 16/965,798

(22) PCT Filed: Feb. 2, 2018

(86) PCT No.: PCT/SE2018/050083
§ 371 (c)(1),
(2) Date: Jul. 29, 2020

(87) PCT Pub. No.: WO2019/151914
PCT Pub. Date: Aug. 8, 2019

(65) Prior Publication Data
US 2021/0051815 A1    Feb. 18, 2021

(51) Int. Cl.
*H05K 7/20*    (2006.01)

(52) U.S. Cl.
CPC .................. *H05K 7/2039* (2013.01)

(58) Field of Classification Search
CPC . H01L 23/467; H01L 23/473; H01L 23/3672; H01L 23/3675; H01L 23/3677;
(Continued)

(56) References Cited

U.S. PATENT DOCUMENTS

| 3,421,578 A | * | 1/1969 | Marton | H01F 27/085 |
| | | | | 257/722 |
| 3,956,673 A | * | 5/1976 | Seid | H05K 7/20572 |
| | | | | 165/170 |

(Continued)

FOREIGN PATENT DOCUMENTS

| DE | 102013000223 A1 | 12/2013 |
| EP | 2941109 A1 | 11/2015 |

(Continued)

OTHER PUBLICATIONS

International Search Report and Written Opinion of the International Searching Authority for International Application No. PCT/SE2018/050083, dated Oct. 23, 2018.

*Primary Examiner* — Adam B Dravininkas
(74) *Attorney, Agent, or Firm* — Sage Patent Group (57) ABSTRACT

A cooling device for dissipating heat from an object. The cooling device comprises a base part arranged for contact with the object, and fins attached to and protruding from the base part in a direction substantially away from the object when in use. The fins are arranged in a first configuration adapted for heat dissipation by natural convection of air and in a second configuration adapted for heat dissipation by forced convection of ambient air movement such as wind. Thereby, the cooling device can provide ample or at least adequate cooling effect on the object both when there is more or less ambient air movement chiefly using the second configuration, and when the ambient air is not moving chiefly using the first configuration.

13 Claims, 8 Drawing Sheets

(58) Field of Classification Search
CPC .............................. H01L 23/367; H05K 1/0203;
H05K 7/20409; H05K 7/20172; H05K
7/20154; H05K 7/20127; H05K 7/20136;
H05K 7/20145; H05K 7/20181; H05K
7/2019; H05K 7/20418; H05K 7/20;
H05K 7/20427; F28F 3/022; F28F 3/02;
F28F 3/025; F28F 3/04; F28F 3/06; F28F
3/042; F28F 3/048; F28F 3/027; F28F
2215/10; F28F 2215/00; F28F 2215/02;
F28F 2215/04; F28F 2215/08; F28F
2215/06; F28F 2215/12; F28F 2215/14
See application file for complete search history.

(56) References Cited

U.S. PATENT DOCUMENTS

| | | | | |
|---|---|---|---|---|
| 4,177,499 | A * | 12/1979 | Volkmann | H05K 7/209 |
| | | | | 361/710 |
| D284,076 | S * | 6/1986 | Moeller | D13/184 |
| D287,718 | S * | 1/1987 | Moeller | H05K 7/209 |
| | | | | D13/184 |
| D292,914 | S * | 11/1987 | Moeller | D13/184 |
| 4,794,982 | A * | 1/1989 | Corkigian | H01F 27/025 |
| | | | | 165/905 |
| 5,150,278 | A * | 9/1992 | Lynes | H05K 7/1015 |
| | | | | 165/80.3 |
| 5,513,071 | A * | 4/1996 | LaViolette | H05K 7/20545 |
| | | | | 257/722 |
| 5,597,034 | A | 1/1997 | Barker, III et al. | |
| D378,915 | S * | 4/1997 | Widmayer | D13/179 |
| D379,088 | S * | 5/1997 | Hopper | H05K 7/20 |
| | | | | D13/152 |
| 6,313,399 | B1 * | 11/2001 | Suntio | F28F 3/048 |
| | | | | 174/16.3 |
| D458,228 | S * | 6/2002 | Jacobson | D13/152 |
| 6,945,319 | B1 | 9/2005 | Li et al. | |
| 7,535,716 | B2 * | 5/2009 | Fischer | H04Q 1/10 |
| | | | | 174/50.54 |
| D703,132 | S * | 4/2014 | Pearson | H05K 7/20545 |
| | | | | D13/107 |
| D806,647 | S * | 1/2018 | Lau | D13/110 |
| 2004/0256085 | A1 * | 12/2004 | Barsun | F28F 3/02 |
| | | | | 257/E23.099 |
| 2008/0236791 | A1 * | 10/2008 | Wayman | H01L 23/467 |
| | | | | 165/170 |
| 2011/0188205 | A1 * | 8/2011 | MacManus | H05K 7/20 |
| | | | | 361/703 |
| 2012/0063088 | A1 * | 3/2012 | Fu | H01L 23/467 |
| | | | | 165/67 |
| 2013/0175021 | A1 | 7/2013 | Takigawa et al. | |

FOREIGN PATENT DOCUMENTS

| | | |
|---|---|---|
| EP | 3240385 A1 | 11/2017 |
| JP | 2017098274 A | 6/2017 |
| WO | 2015043183 A1 | 4/2015 |

* cited by examiner

COOLING DEVICE FOR DISSIPATING HEAT FROM AN OBJECT

CROSS REFERENCE TO RELATED APPLICATION

This application is a 35 U.S.C. § 371 national stage application of PCT International Application No. PCT/SE2018/050083 filed on Feb. 2, 2018, the disclosure and content of which is incorporated by reference herein in its entirety.

TECHNICAL FIELD

The present disclosure relates generally to a cooling device for dissipating or dispelling heat from an object such as a radio unit, a digital unit, a processor or other electronic equipment, which may generate considerable heat when in operation.

BACKGROUND

In certain fields of technology, some electric or electronic devices and equipment generate substantial amounts of heat when in operation so that it is necessary to dissipate the generated heat from them by applying a cooling device such as a heat sink or the like, in order to avoid excessive temperatures and resulting damage and/or malfunctioning. Particularly in the fields of telecommunication and computers, many active elements and components are designed with ever-increasing speed and capacity, which puts even greater demands on the cooling ability of the cooling devices that must be applied to those parts. Further, certain elements such as radio units, digital units and processors must be designed with reduced size due to space constraints, and consequently the cooling device used must also have a very limited size, at the same time providing sufficient cooling ability. It is thus challenging to provide a cooling device, also referred to as a heatsink, with small dimensions but very high cooling ability.

Conventional heatsinks or cooling devices of today are typically designed with fins protruding from a flat base plate that is applied to the object to be cooled, such that the fins conduct heat from the object and the heat is then dispelled from the fins by convection of the surrounding air. The fins thus increase the surface in contact with air substantially compared to a flat plate. There are basically two mechanisms for moving the air across the fins: 1) Natural convection which is caused by heated air tending to move upwards relative to cooler air which has higher density, and 2) Forced convection which is created by using a fan or the like to move the air. These two mechanisms require different designs of a cooling device to provide the best possible performance, i.e. cooling ability.

FIGS. 1A-E illustrate some conventional heatsinks comprising fins 100 protruding from one side of a base part 102 to which an object to be cooled, not shown, is applied on its opposite side. The fins may be designed as continuous elongated plates 100A, 100B, 100E, or as pins 100D, or as plates 100C with openings or gaps. The plate fins 100A-C, E are typically designed basically with a rectangular form. The pins 100D are shown as having a cylindrical form, although they are not restricted to the circular or cylindrical form and can have any form or shape.

Some problems associated with conventional heatsink designs of today will now be discussed. If only natural convection is available, i.e. there is no forced movement of air, the above-described structures with fins can be designed in such a way that the best possible cooling effect is achieved. On the other hand, if forced convection is available the fins should be designed somewhat differently, e.g. in terms of form, pattern and spacing of the plates, in order to achieve the best possible cooling effect.

Hence, in an environment where natural convection alone and added sources of forced convection such as wind may occur at different times, it is necessary to employ a fin design which is a tradeoff between the two above-mentioned optimal designs in order to provide the best overall cooling ability, which may thus not be optimal for either of the two convection mechanisms. It is also possible to employ a fin design which is optimized for one convection mechanism while getting a poorer performance for the other convection mechanism. WO 2015/043183 discloses some examples of how a cooling device may be adapted for natural convection using a so-called "chimney effect" and where secondary fins are mounted to the tips of plate fins. However, it is a problem that in either of the above designs the cooling effect may not be sufficient or adequate by not providing enough heat dissipation by natural convection or forced convection, or both.

SUMMARY

It is an object of examples described herein to address at least some of the problems and issues outlined above. It is possible to achieve this object and others by using a cooling device as defined in the attached independent claim.

According to one aspect, a cooling device is arranged to dissipate heat from an object. The cooling device comprises a base part arranged to be in contact with the object, and a plurality of fins attached to and protruding from the base part in a direction substantially away from the object when in use.

In this cooling device, the fins are arranged in a first configuration adapted for heat dissipation by natural convection of air and in a second configuration adapted for heat dissipation by forced convection of ambient air movement. Thereby, it is an advantage that the cooling device is able to provide a good or even optimal cooling effect both when forced convection, e.g. wind or other air movement, is available by utilizing the second configuration, and also when only natural convection basically occurs by utilizing the first configuration. The first and second configurations may be positioned on respective regions on the base part, which regions may be separated or at least partly overlapping.

The above cooling device may be configured and implemented according to different optional examples to accomplish further features and benefits, to be described below.

BRIEF DESCRIPTION OF DRAWINGS

The solution will now be described in more detail by means of some examples and with reference to the accompanying drawings, in which.

DETAILED DESCRIPTION

Briefly described, a cooling device with fins attached to a base part is provided with enhanced cooling ability when the base part is in contact with an object or product to be cooled. The cooling device may advantageously be used in an outdoor-like environment where air movement by wind typically occurs to create forced convection, which is utilized to achieve efficient flow of air across and through the fins of the cooling device.

In this solution, it has been realized that for natural convection a certain configuration of the fins can be employed in a cooling device to provide an adequate or even optimal cooling effect, while a different configuration of the fins can be employed in the same cooling device to likewise provide an adequate or even optimal cooling effect when forced convection is available. The cooling device described herein can thus be seen as a hybrid heatsink which is adapted, or even optimized, for both natural and forced convection. This way, the occurrence of wind or other air movement can be utilized to provide forced convection across the cooling device and an added cooling effect is obtained "for free".

An advantage of the examples described herein is that the cooling device is able to provide a good or adequate cooling effect both when forced convection is available, e.g. through outdoor wind, and when it is not available such that only natural convection basically occurs, e.g. at times with no wind. This is achieved by arranging a plurality of fins in a first configuration adapted for heat dissipation by natural convection of air, and also in a second configuration adapted for heat dissipation by forced convection from ambient air movement. The first and second configurations may be employed in separate or overlapping regions on a base part, to be described in more detail below.

Figure 1A:
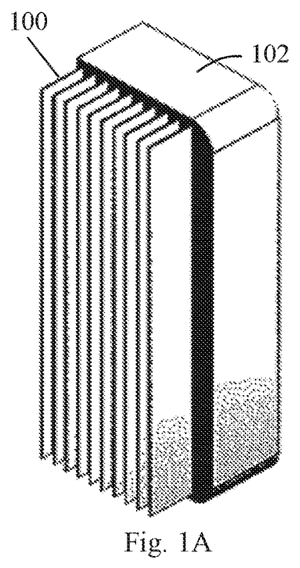
FIGS. 1A-E illustrate some examples of how a cooling device could be configured according to the prior art.
Figure 1B:
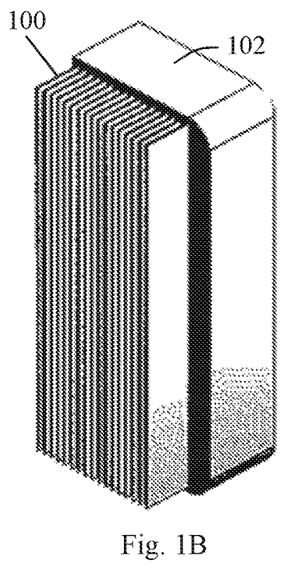
Figure 1C:
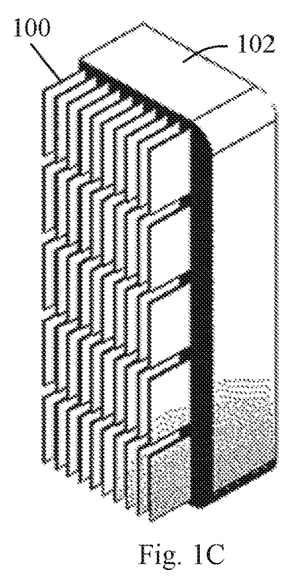
Figure 1D:
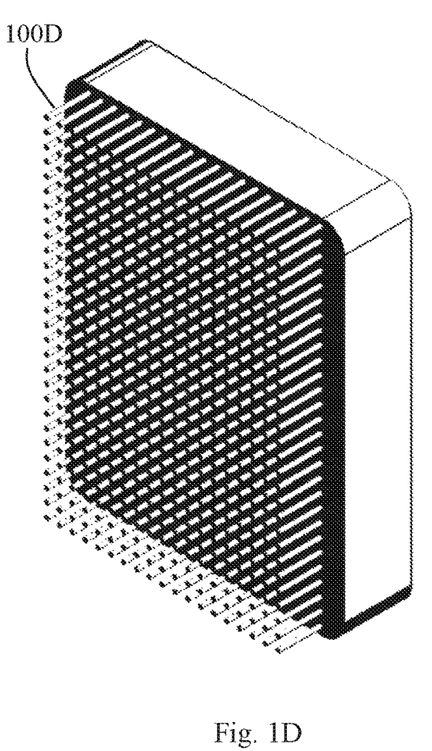
Figure 1E:
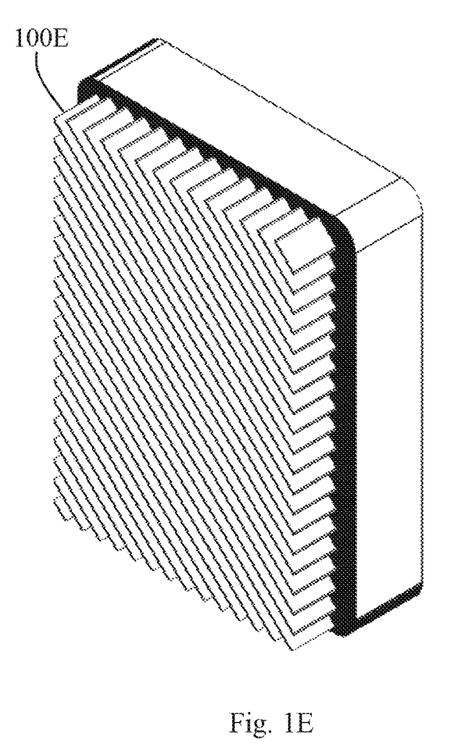
Figure 2:
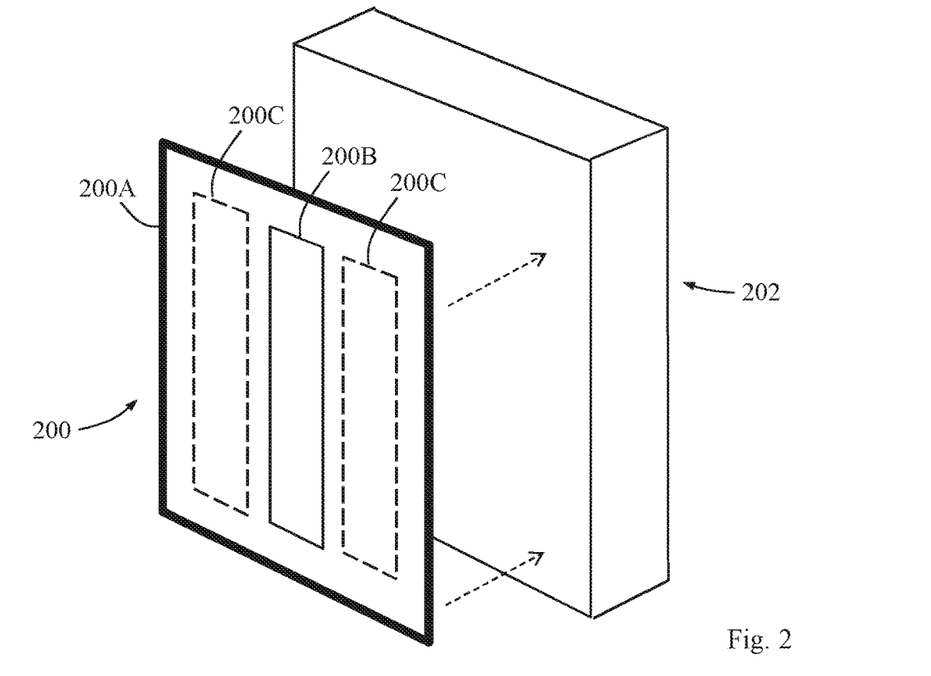
FIG. 2 illustrates schematically how a cooling device may be configured with different configurations of fins adapted for heat dissipation by natural and forced convection, according to one example.

The above features and advantages may be accomplished by a cooling device for dissipating heat from an object, as schematically illustrated in FIG. 2 where the cooling device 200 is applicable to an object 202 to be cooled, as indicated by dashed arrows. The object 202 is only shown as a block for simplicity although it may have any shape or structure which is of no particular relevance to the examples herein. As mentioned above, the object 202 that needs cooling may be a heat-generating component or element, such as a radio unit, a digital unit, a computer, etc., while the examples herein are not limited to any specific type of object(s).

The cooling device 200 comprises a base part 200A arranged to be in contact with the object, in this figure by applying the backside of the base part 200A into contact with the object 202. When in use, the base part 200A may be more or less tightly attached to the object 202 so as to enable conduction of heat from the object 202 to the base part 200A.

The cooling device 200 further comprises a plurality of fins, not shown in detail in this figure, attached to and protruding from the base part 200A in a direction substantially away from the object 202 when in use. The fins are arranged in a first configuration 200B adapted for heat dissipation by natural convection of air and in a second configuration 200C adapted for heat dissipation by forced convection of ambient air movement. It is thus assumed that the fins protrude from the base part 200A opposite the object 202 in different configurations 200B, 200C, which can be realized in different ways to be described herein.

The above cooling device 200 is able to take advantage of the cooling potential available from fluctuating wind at any ambient condition, particularly applicable to the outdoor environment. Experience has shown that the wind magnitude and fluctuation/turbulence intensity increases with increasing temperature. This is especially advantageous in hot climates where the wind blows more intensely and continuously than in colder climates. This has the potential of decreasing the average temperatures of outdoor units and thereby increasing the lifetime and reliability of the object that is cooled. Further advantages include the possibility to decrease the size and weight of the cooling device when aimed at hotter climates.

In the example of FIG. 1, the fins of the first and second configurations 200B, 200C are positioned at different regions comprising a central region with the first configuration 200B flanked by two outer regions with the second configuration 200C. Other examples of how regions with the first and second configurations can be distributed and positioned on the base part will be described later below. In this description, "configuration" refers to a particular design of the fins with respect to shape, size, spacing, dimensions, etc., so that the first and second configurations 200B are adapted, or even optimized, for heat dissipation by natural and forced convection, respectively, by having particularly favourable cooling abilities for the two respective convection types.

Figure 3:
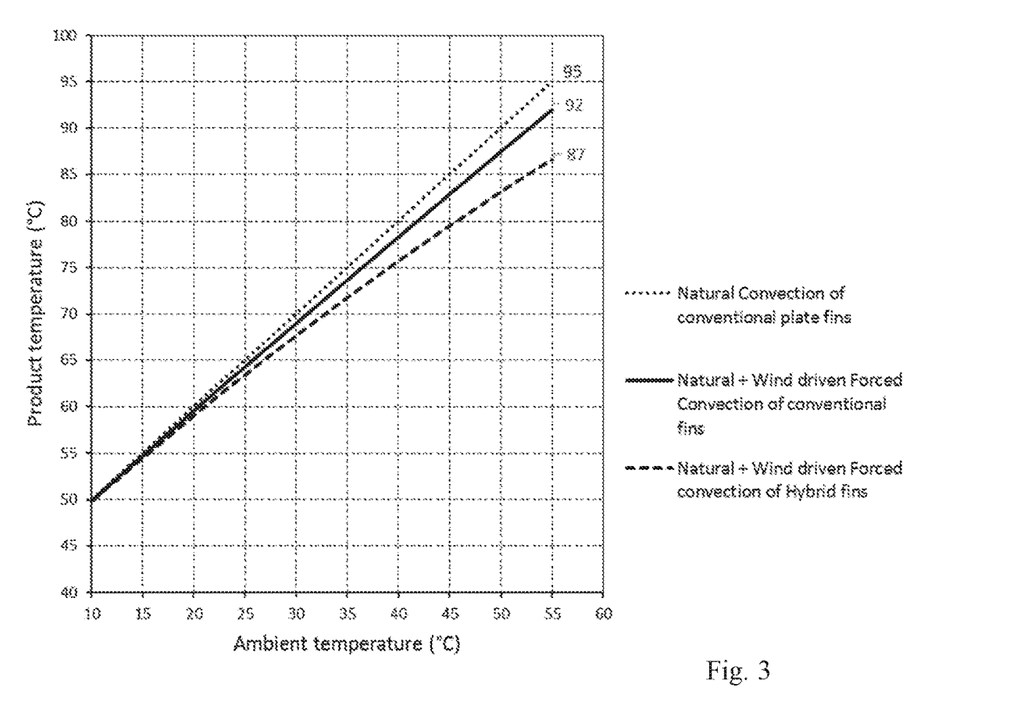
FIG. 3 is a diagram illustrating a comparison of how the temperature of a cooled object or product varies with ambient temperature when a cooling device comprises conventional fins and hybrid fins, respectively.

FIG. 3 is a diagram with practical measurements of the temperature of a cooled object or product, "Product temperature", at different ambient temperatures, i.e. the surrounding air temperature, for different fin configurations in a cooling device. The curves thus indicate the performance of the cooling device. As a reference, a first dotted curve illustrates the product/object temperature when a conventional fin design is used and no forced convection is available, i.e. when only natural convection occurs.

A second continuous curve illustrates the product/object temperature when the conventional fin design is used, referred to as "Conventional Plate fins" in the figure, and forced convection is available in addition to the natural convection, which indicates an improved cooling effect due to forced convection so that this curve falls increasingly below the dotted curve with increasing ambient temperature.

A third dashed curve illustrates the product/object temperature when a fin design according to any of the examples herein is used, referred to as "Hybrid fins", and when both forced and natural convection occur. In this case, even lower product temperatures are achieved which implies that the cooling effect further improves significantly when wind driven forced convection constitutes a larger contribution than natural convection, as compared to the conventional fin design.

Some examples of how the above-described cooling device can be implemented in practice will now be described, sometimes with reference to the following figures. In one example, the fins of the second configuration may be adapted to produce a larger pressure gradient than the fins of the first configuration when air flows through the fins of the first and second configurations. The term "pressure gradient" implies specifically a local pressure difference resulting in a "drop" in air flow pressure in the direction of the flow when passing through a section of fins. This basically means that a greater air pressure is needed to "push" air through a given fin section of the second configuration than to push air of a similar flow volume through a section of fins of the first configuration. Consequently, more air flow caused by forced convection will tend to pass through the fins of the second configuration at a higher velocity, than through the fins of the first configuration. Thereby, the cooling device can be constructed so that air will pass through the appropriate cooling fins of either configuration for adequate or even optimal cooling effect under various ambient conditions, both during wind driven forced convection and natural convection.

In another example, the second configuration may have a smaller spacing between its fins than the first configuration. Thereby, the above-described pressure gradient will be larger for air passing through the fins of the second configuration as compared to the first configuration since smaller spacing between the fins will require larger forcing from the air to pass through.

In another example, the fins of at least one of the first and second configurations are adapted to guide ambient air in a tilted direction relative to a vertical direction when in use. In this case, another example may be that the orientation of the fins is arranged to substantially coincide with a typical direction of the ambient air movement when in use. In an outdoor deployment, the air may tend to blow mostly in a certain direction, e.g. due to existing wind currents or the like, and it is then possible to arrange plate-like fins so that channels between the fins will have more or less the same orientation as the prevailing winds, which in turn will facilitate the blowing air to enter the channels and create efficient cooling by contact with the fins.

In further examples, the fins of the first configuration may be positioned on a first region of the base part and the fins of the second configuration may be positioned on a second region of the base part. In this case, another example may be that the second region is separate from the first region on the base part. In this case it may be favourable to place the cooling device in a certain position on the object depending on where the heat is generated locally. Some alternatives of how the first and second regions could be arranged separately on the base part will now be described with reference to the following figures where the first region(s) is indicated by a dotted line and the second region(s) is indicated by a dashed line.

Figure 4A:
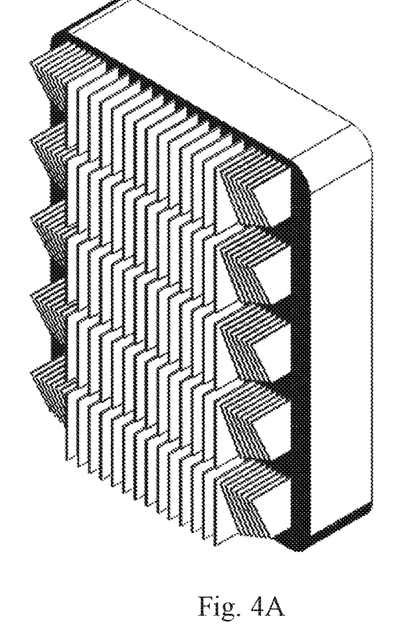
FIGS. 4A-B illustrate perspective and front views of an example where a base part of a cooling device comprises separate regions with different respective configurations of fins.
Figure 4B:
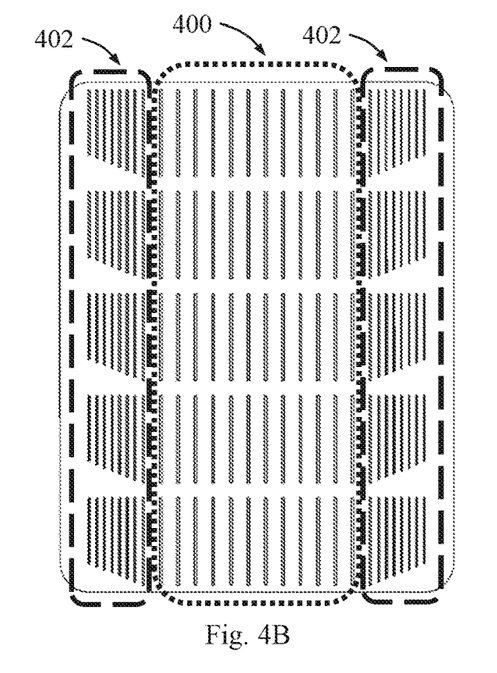
Figure 5A:
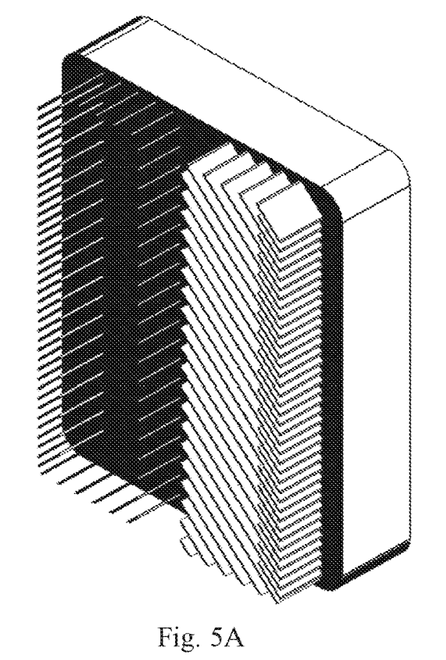
FIGS. 5A-B illustrate perspective and front views of another example where a base part of a cooling device comprises separate regions with different respective configurations of fins.
Figure 5B:
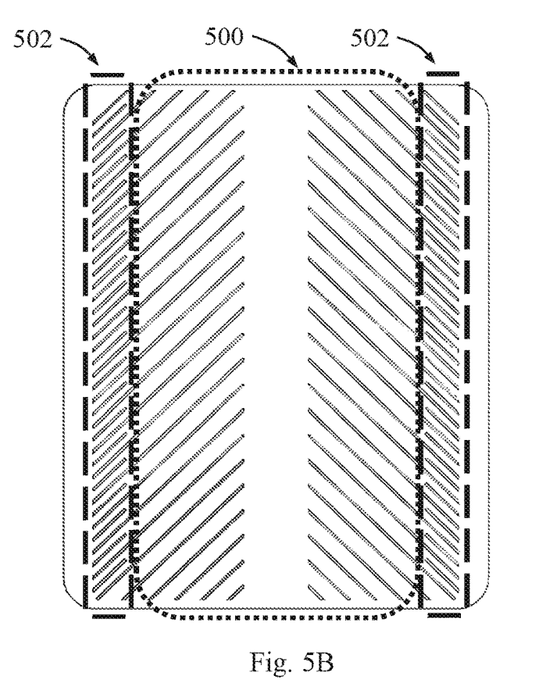

In one alternative, the first region may be situated at a substantially central position on the base part and the second region may be situated at opposite sides of the first region. FIGS. 4A-B illustrate how this alternative may be realized where a central region 400 with the first configuration of fins is flanked by two outer regions 402 with the second configuration, as similar to the positioning of configurations 200B, 200C shown in FIG. 2. In this case, the fins are implemented as plates with a vertical orientation relative to the base part. Another way of realizing this alternative is illustrated in FIGS. 5A-B where a central region 500 with the first configuration of fins is likewise flanked by two outer regions 502 with the second configuration, with the difference that the fins are implemented as plates with a slanted or tilted orientation relative to the base part.

Figure 6A:
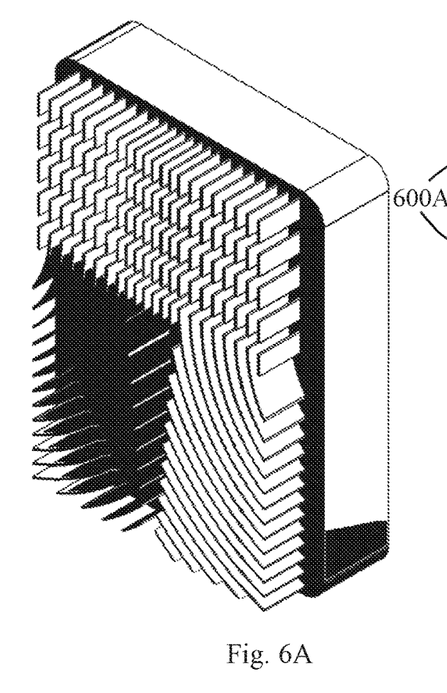
FIGS. 6A-B illustrate perspective and front views of yet another example where a base part of a cooling device comprises separate regions with different respective configurations of fins.
Figure 6B:
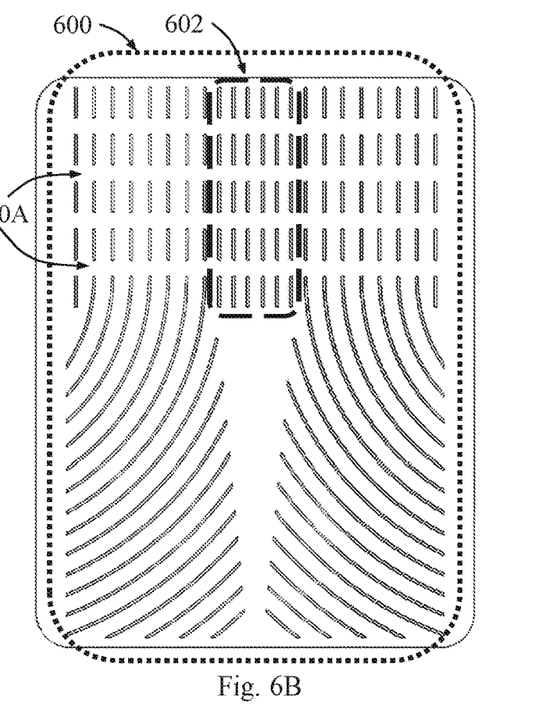

In another alternative, the second region may be situated at a substantially central position on the base part and the first region is situated at opposite sides of the second region. FIGS. 6A-B illustrate how this alternative may be realized where a central region 602 with the second configuration of fins is flanked and more or less surrounded by an outer region 600 with the first configuration where plate-like fins are also curved so as to direct air from the sides towards the middle. Thereby, air entering from either side with forced convection through the shown lower part of the outer region 600, will be guided by the fins of the first configuration towards and through the central region 602 with the second configuration where the dissipation of heat is favourable or even optimized for forced convection. Further, the upper part of the outer region 600 have openings or gaps 600A which allow air of natural convection guided towards the middle by the lower part to pass through the outer region 600 rather than through the central region 602.

Figure 7A:
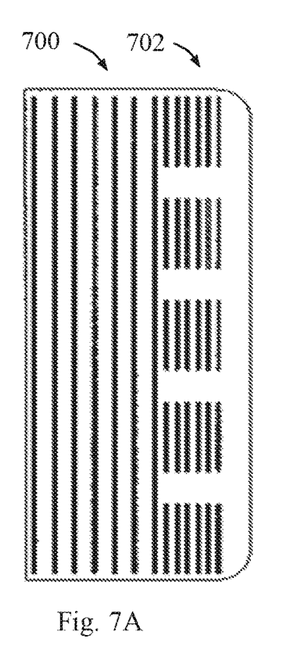
FIGS. 7A-C illustrate front views of some further examples of how different configurations of fins may be arranged at various regions of the base part.
Figure 7B:
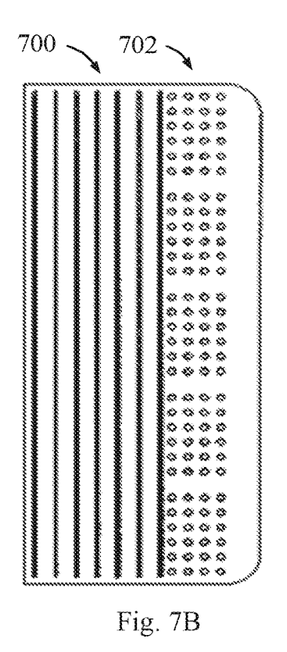
Figure 7C:
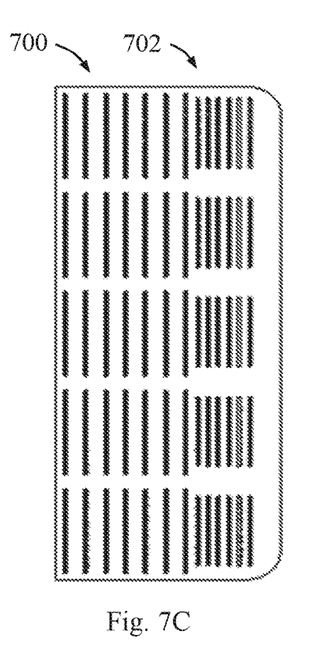

FIGS. 7A-C illustrate some further examples of how a central region 700 with the first configuration of fins may be flanked by outer regions 702 with the second configuration.

In another alternative, the second region may be distributed at multiple positions on the base part and the first region is distributed between the positions of the second region. FIGS. 8A-D illustrate some none-limiting examples of how this alternative may be realized where the above-described regions are marked only on the right side of the figures while it should be understood that the left side of the figures have corresponding regions, not shown.

Figure 8A:
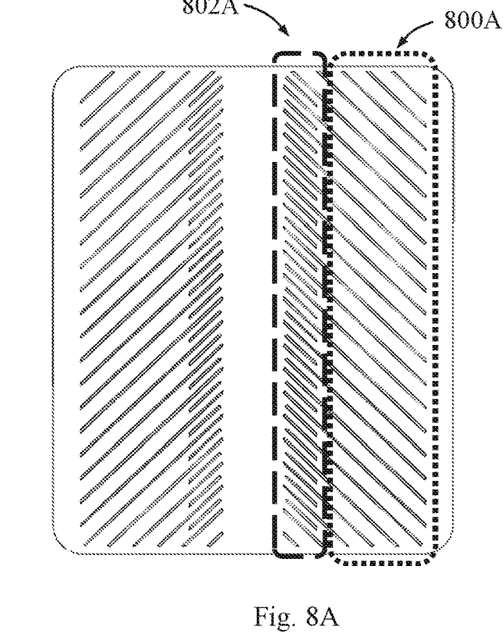
FIGS. 8A-D illustrate front views of some further examples of how different configurations of fins adapted for heat dissipation by natural and forced convection may be arranged at alternating positions on the base part.
Figure 8B:
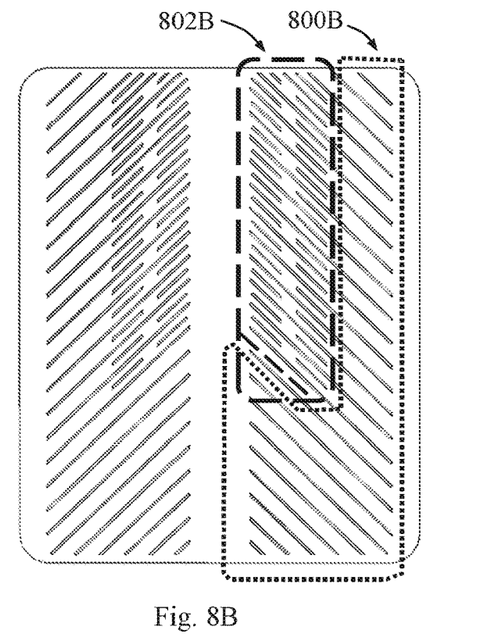
Figure 8C:
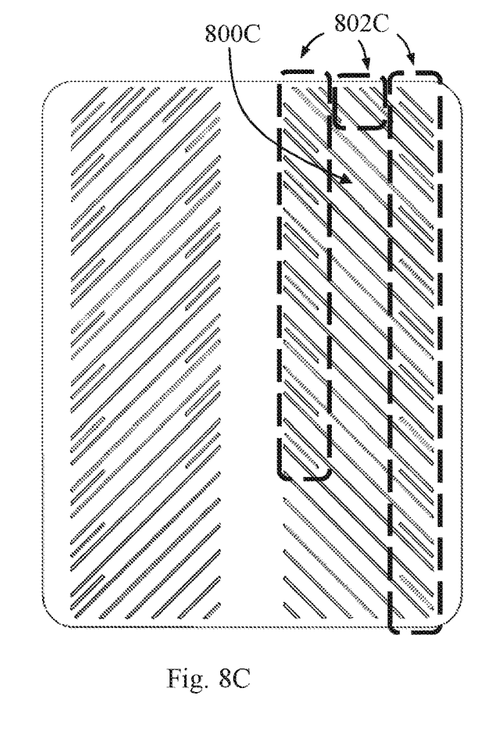
Figure 8D:
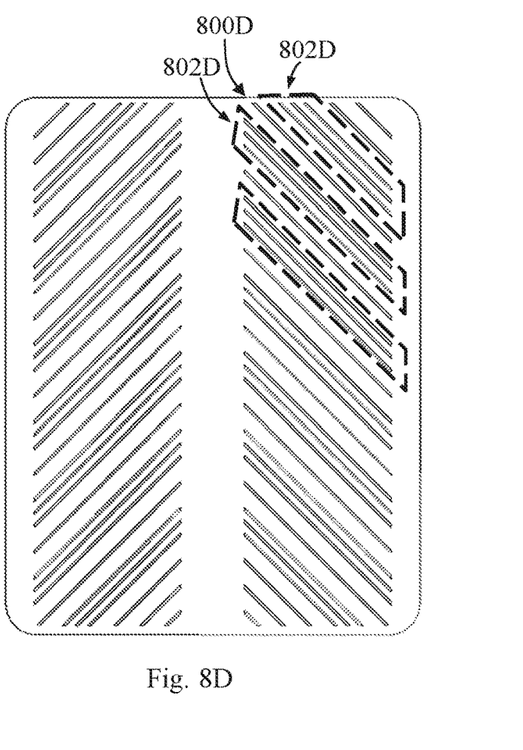

In FIG. 8A, both the first regions 800A and the second regions 802A extend in a parallel manner essentially along the entire base part. In FIG. 8B, the second regions 802B extend only along a limited length of the base part while the first regions 800B extend essentially along the entire base part and also below the second regions 802B as shown. In FIG. 8C, multiple second regions 802C extend in a parallel manner along different lengths of the base part while the first regions 800C extend essentially along the remaining lengths of the base part and essentially below the second regions 802C as shown. In FIG. 8D, multiple second regions 802D extend in a parallel manner but at an angle to the base part while the first regions 800D extend essentially between the second regions 802D.

In the above-described alternatives, the second region was separate from the first region on the base part. In another example, the second region may at least partly overlap the first region on the base part. Thereby, the cooling can be made efficient for both natural and forced convection across the entire base plate so that it is not necessary to place the cooling device in a certain position depending on where the heat is generated locally.

Figure 9A:
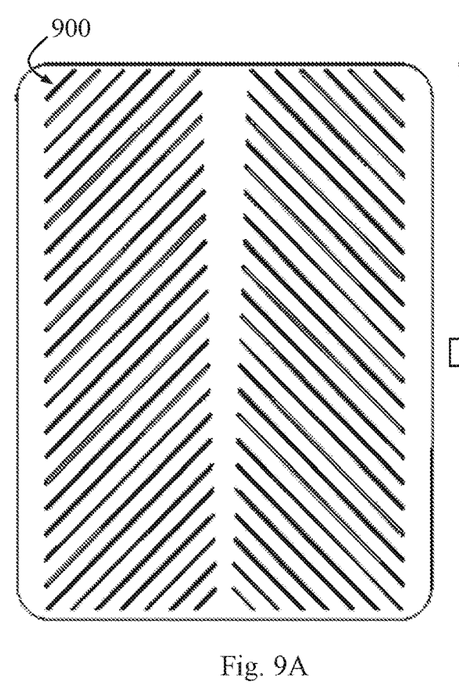
FIGS. 9A-D illustrate an example of how fins may be developed from a more conventional design with long continuous plate-like fins to provide different configurations in the same region on a base part, and how air is moving through the fins at natural and forced convection, respectively.

In another example, when the second region overlaps the first region, the fins of the first configuration may have one characteristic and the fins of the second configuration may have another characteristic across the same area of the base part. FIG. 9A illustrates a more conventional fin structure of a cooling device, and FIG. 9B illustrates how this fin structure has been modified to realize the latter example with overlapping first and second regions.

Figure 9B:
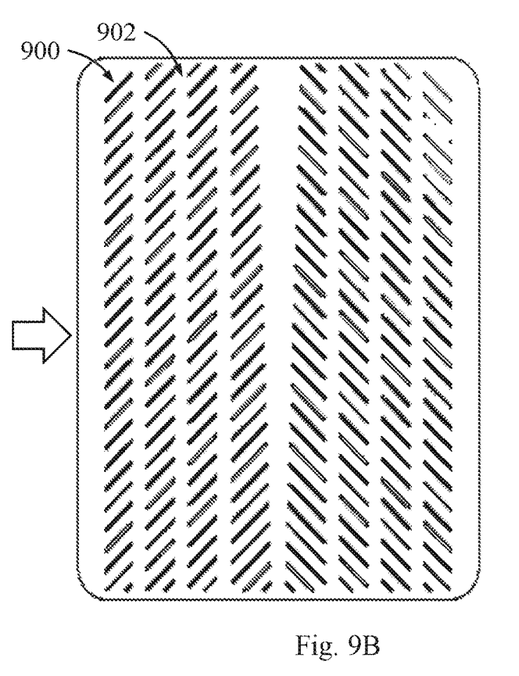
Figure 9C:
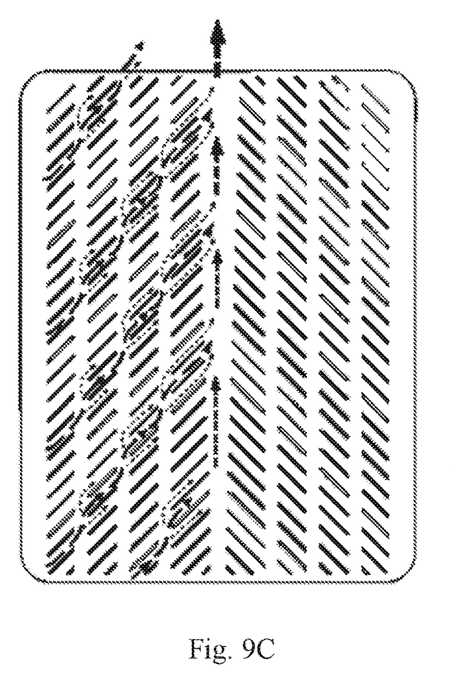
Figure 9D:
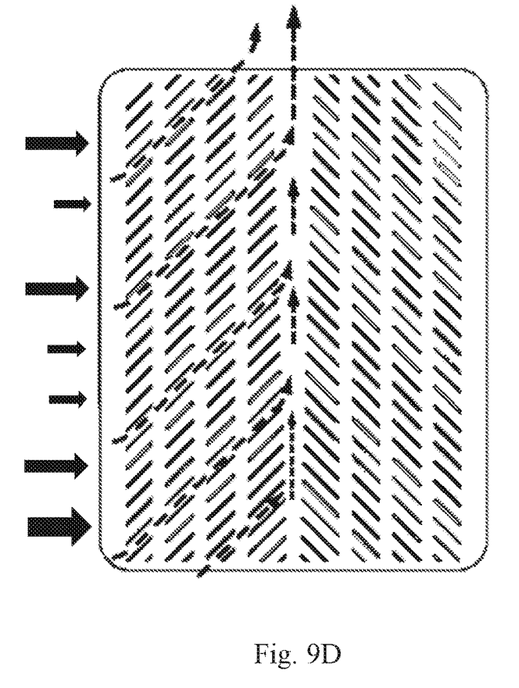
Figure 9E:
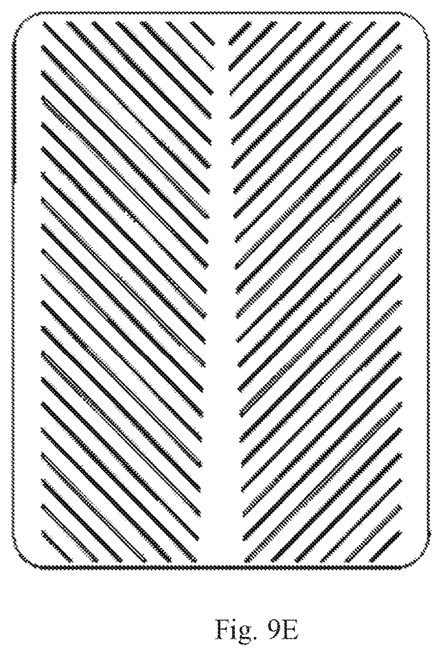
FIGS. 9E-H illustrate two further examples of how fins may be developed from a more conventional design, so as to provide the first and second configurations.
Figure 9F:
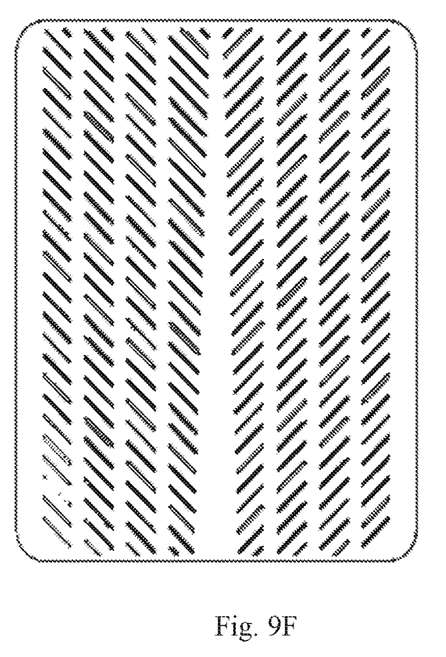
Figure 9G:
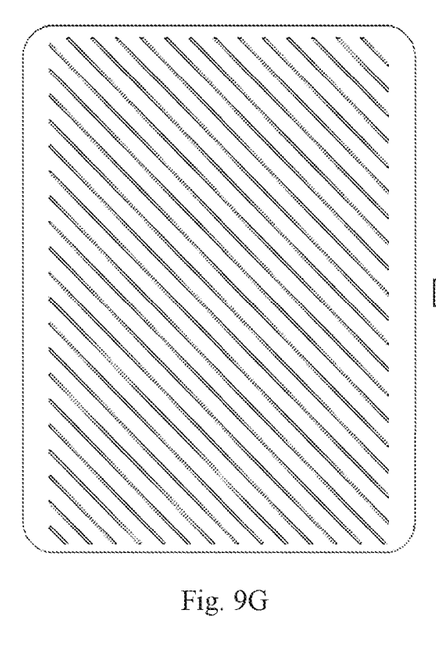
Figure 9H:
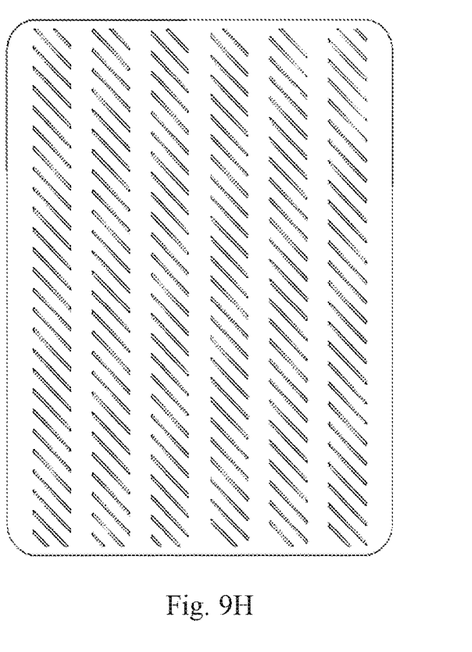
Figure 10A:
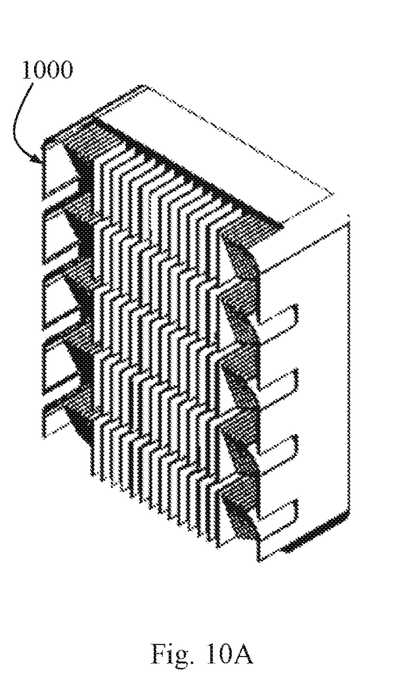
FIGS. 10A-B illustrate some further examples of how fins adapted for heat dissipation by forced convection may be designed to incorporate covers or shields.
Figure 10B:
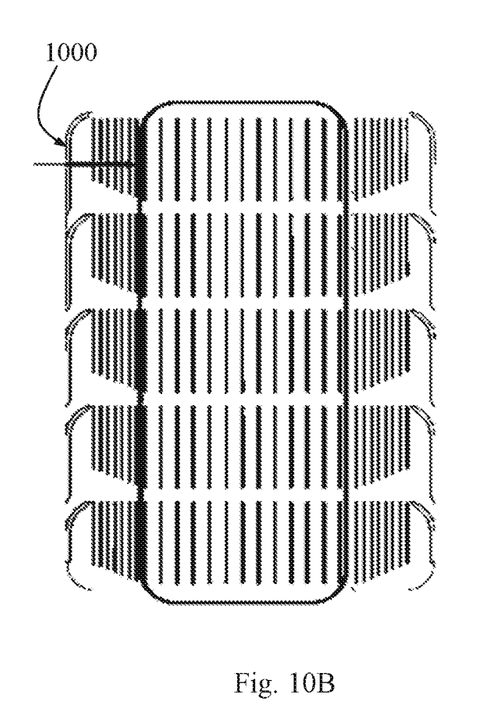

Another example, as shown in FIG. 9B, may be that the fins are arranged as parallel plates 900 and the characteristic of the fins of the first configuration is achieved by openings 902 in the plates to allow or improve natural convection of air, while the characteristic of the fins of the second configuration is achieved by limited spacing between the plates 900 for forced convection of air. FIG. 9C illustrates how air would flow through the fin structure of FIG. 9B when only natural convection occurs where the air passes largely through the gaps. FIG. 9D illustrates how air would flow through the fin structure of FIG. 9B when forced convection is available, e.g. by wind blowing from the left side of the figure, such that the air passes largely through the plates and less through the gaps.

FIGS. 9E-F and 9G-H, respectively, illustrate two further examples of how fins may be developed from a more conventional design by introducing openings in elongated plates, so as to provide the first and second configurations in a similar manner as described above for FIGS. 9A-D.

In another example, the fins of at least one of the first and second configurations may have an elongated form. In this case, another example may be that the elongated form of at least some of the fins is interrupted by one or more spaces or gaps, e.g. as shown in FIGS. 7A-C. In yet another example, at least some of the fins with elongated form may be at least partly curved, e.g. as shown in FIGS. 6A-B in the lower part of region 600 having the first configuration.

While the solution has been described with reference to specific exemplifying embodiments, the description is generally only intended to illustrate the inventive concept and should not be taken as limiting the scope of the solution. For example, the terms "cooling device", "heat sink", "configuration", "natural convection" and "forced convection" have been used throughout this disclosure, although any other corresponding entities, functions, and/or parameters could also be used having the features and characteristics described here. The solution is defined by the appended claims.

The invention claimed is:

1. A cooling device for dissipating heat from an object, the cooling device comprising:
a single base part arranged to be in contact with the object, and
a plurality of parallel plates parallel to each other and attached to and protruding from the single base part in a direction substantially away from the object when in use,
wherein the plurality of parallel plates are tilted to guide flow from incoming ambient air movement in a tilted direction relative to a vertical direction when the cooling device is in use,
wherein a limited spacing is formed between two adjacent parallel plates among the plurality of parallel plates,
wherein at least some of the plurality of parallel plates each comprises a plurality of separated fins extending in alignment with each other and at least one opening formed between and separating two adjacent separated fins among the plurality of separated fins,
wherein a plurality of corresponding openings of the at least some of the plurality of parallel plates are in alignment with each other in a direction substantially parallel to the vertical direction when the cooling device is in use,
wherein the plurality of separated fins are arranged partially in a first configuration adapted for heat dissipation by natural convection due to still ambient air conditions and partially in a second configuration adapted for heat dissipation by force convection due to ambient air movement conditions, and
wherein the first configuration comprises rows of the separated fins and the openings for heat dissipation by natural convection due to still ambient air conditions and the second configuration comprises columns of the separated fins and the limited spacing between two adjacent parallel plates for heat dissipation by forced convection due to ambient air movement conditions.

2. The cooling device according to claim 1, wherein the fins of the second configuration are adapted to produce a larger pressure gradient than the fins of the first configuration when air flows through the fins of the first and second configurations due to ambient air movement.

3. The cooling device according to claim 1, wherein the second configuration has a smaller spacing between its fins than the first configuration.

4. The cooling device according to claim 1, wherein the fins of at least one of the first and second configurations are tilted to gluide flow from incoming ambient air movement in a tilted direction relative to a vertical direction when in use.

5. The cooling device according to claim 4, wherein the orientation of the fins is arranged to substantially coincide with a typical direction of the ambient air movement when in use by arranging the fins in a tilted or vertical orientation so that channels between the fins will have about the same orientation as the incoming ambient air.

6. The cooling device according to claim 1, wherein the fins of the first configuration are positioned on a first region of the base part and the fins of the second configuration are positioned on a second region of the base part.

7. The cooling device according to claim 6, wherein the second region is separate from the first region on the base part.

8. The cooling device according to claim 7, wherein the second region is situated at a substantially central position on the base part and the first region is situated at opposite sides of the second region.

9. The cooling device according to claim 6, wherein the second region at least partly overlaps the first region on the base part.

10. The cooling device according to claim 1, wherein the fins of the first configuration have one characteristic and the fins of the second configuration have another characteristic across the same area of the base part.

11. The cooling device according to claim 1, wherein characteristic of the fins of the first configuration is achieved by the openings in the plates to facilitate natural convection of air, while characteristic of the fins of the second configuration is achieved by the limited spacing between the plates for forced convection of air.

12. The cooling device according to claim 1, wherein the fins of at least one of the first and second configurations have an elongated form.

13. The cooling device according to claim 1, wherein each of the plurality of parallel plates has an elongated form, and wherein at least some of the plurality of parallel plates each comprises a plurality of openings each formed between and separating two adjacent separated fins among the plurality of separated fins.

* * * * *